United States Patent
Hu et al.

(10) Patent No.: US 7,569,773 B2
(45) Date of Patent: Aug. 4, 2009

(54) WIRED CIRCUIT BOARD

(75) Inventors: Szu-Han Hu, Osaka (JP); Voon Yee Ho, Osaka (JP); Hiroshi Yamazaki, Osaka (JP); Martin John McCaslin, Fremont, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/902,556

(22) Filed: Sep. 24, 2007

(65) Prior Publication Data

US 2008/0087455 A1    Apr. 17, 2008

(30) Foreign Application Priority Data

Oct. 2, 2006    (JP) .............................. 2006-271036

(51) Int. Cl.
*H01B 7/08* (2006.01)

(52) U.S. Cl. ............................................... 174/117 FF

(58) Field of Classification Search ............ 174/117 FF, 174/261, 268; 333/238
See application file for complete search history.

(56) References Cited

U.S. PATENT DOCUMENTS 4,926,007 A    5/1990    Aufderheide et al.
5,426,403 A *  6/1995    LaLau et al. ................. 333/238
6,353,189 B1   3/2002    Shimada et al.
6,523,252 B1 * 2/2003    Lipponen ..................... 29/828
6,653,915 B1 * 11/2003   Arledge et al. .............. 333/238

* cited by examiner

*Primary Examiner*—Chau N Nguyen
(74) *Attorney, Agent, or Firm*—Jean C. Edwards, Esq.; Akerman Senterfitt

(57) ABSTRACT

A wired circuit board has a plurality of insulating layers, a conductive layer having a signal wiring extending in a longitudinal direction which is covered with the insulating layers, and a signal connecting terminal provided on a longitudinal end of the signal wiring and exposed from the insulating layers, and a ground layer having a ground wiring covered with the insulating layers and formed to surround the signal wiring in a perpendicular direction to the longitudinal direction, and a ground connecting terminal provided on a longitudinal end of the ground wiring and exposed from the insulating layers. The signal connecting terminal and the ground connecting terminal are formed on an upper surface of the same insulating layer among the plurality of the insulating layers.

4 Claims, 9 Drawing Sheets

FIG. 9
(c) 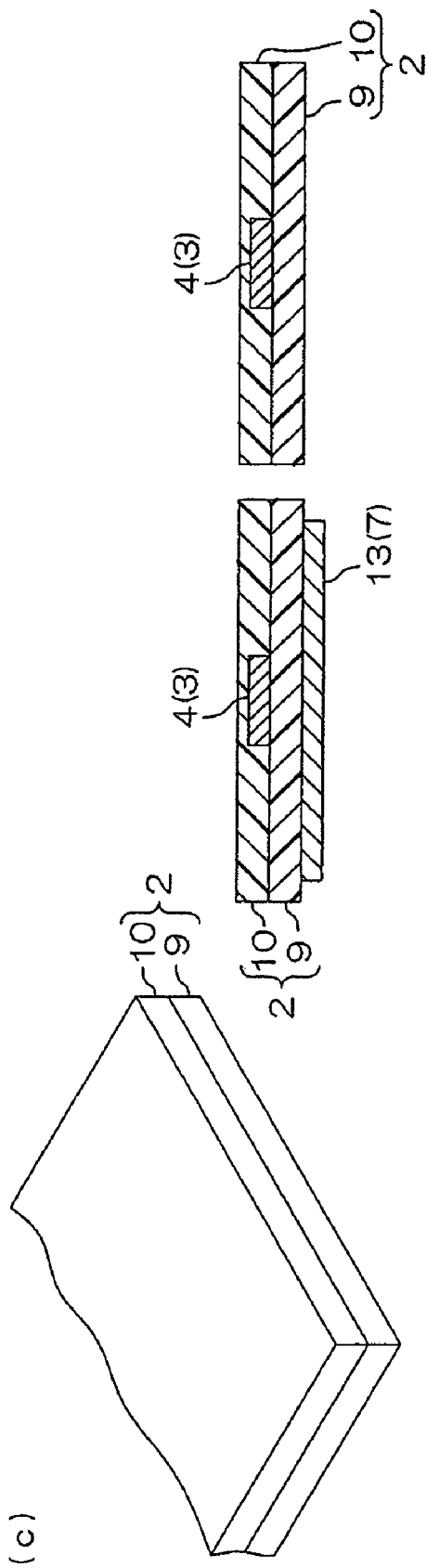
(d) 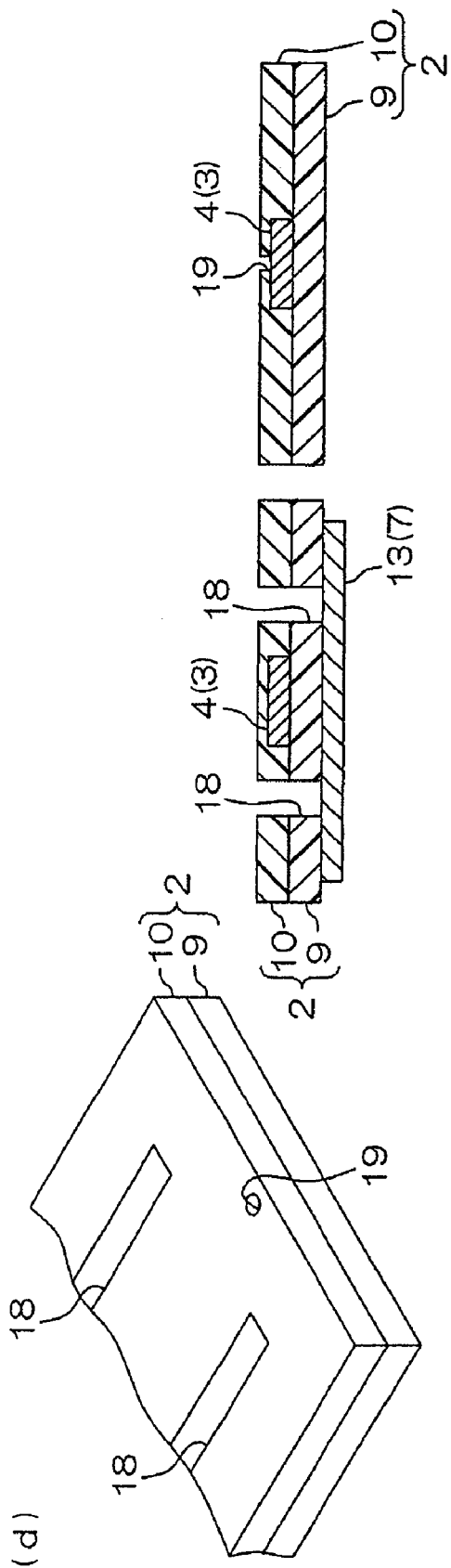

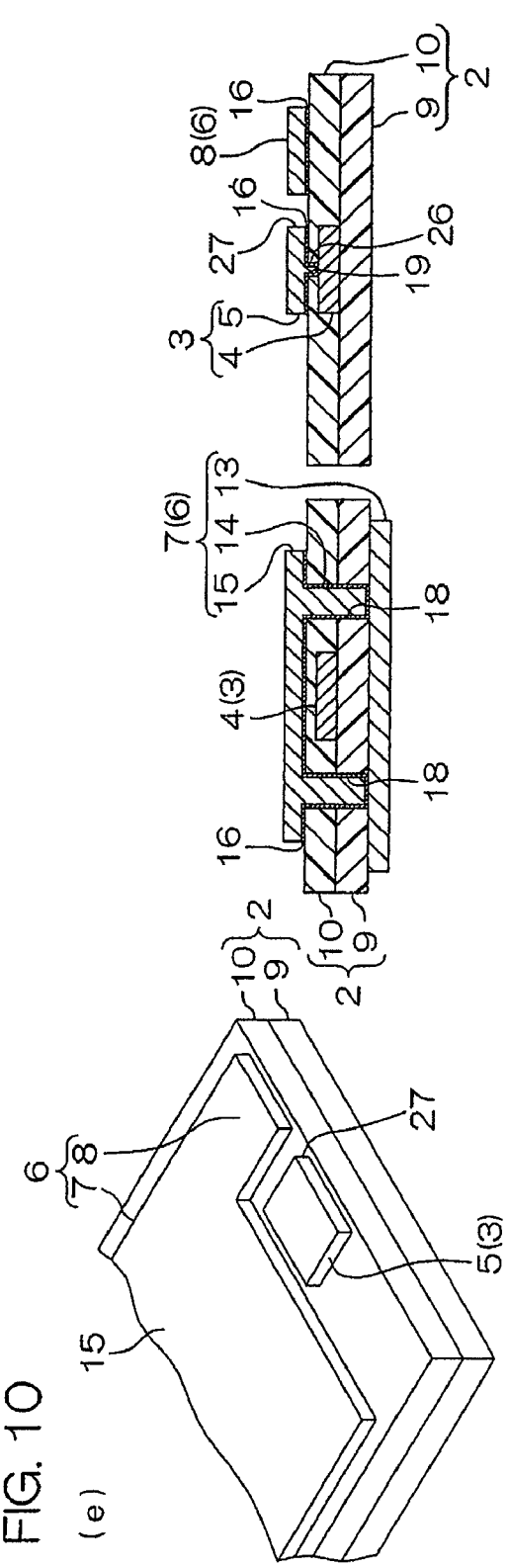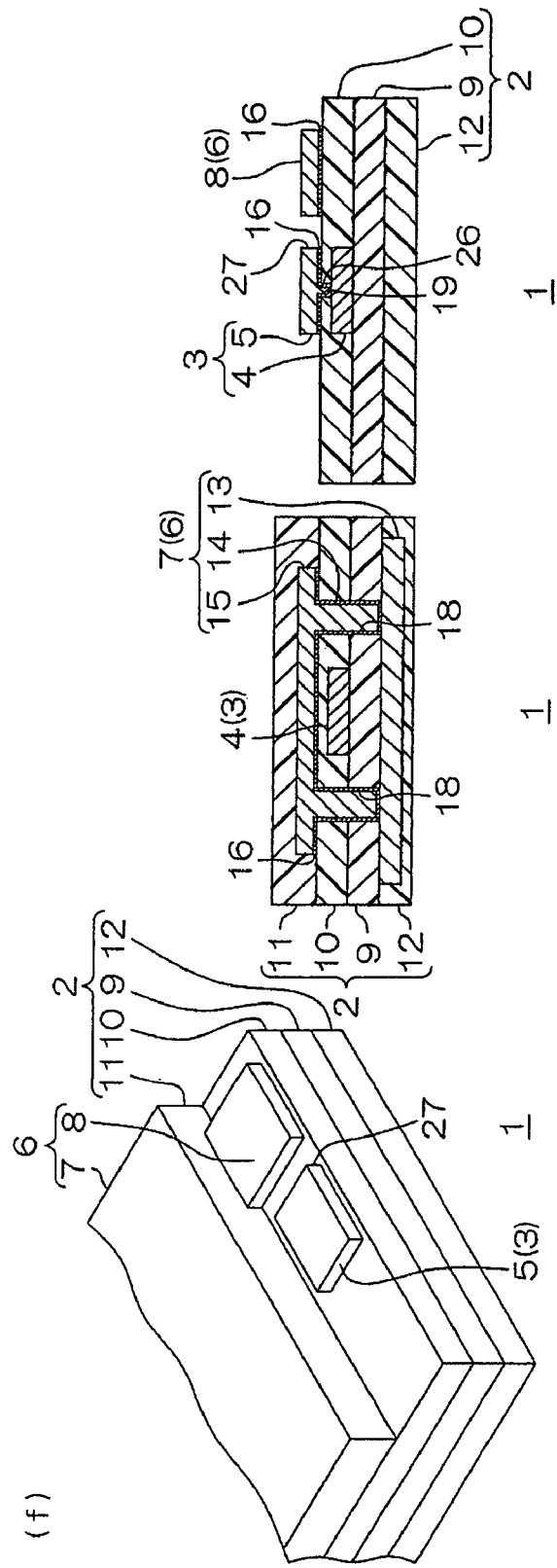
FIG. 10

WIRED CIRCUIT BOARD

CROSS-REFERENCE TO RELATED APPLICATION

The present application claims priority from Japanese Patent Application No. 2006-271036 filed on Oct. 2, 2006, the contents of which are herein incorporated by reference in their entirety.

BACKGROUND OF THE INVENTION

1. Field of the Invention

The present invention relates to a wired circuit board and, more particularly, to a wired circuit board such as a flexible wired circuit board.

2. Description of the Related Art

Conventionally, wired circuit boards such as flexible wired circuit boards have been used in various electronic devices.

In recent years, in terms of higher data density, an increase in the frequency of a signal has been required in such a wired circuit board. However, when the frequency of the signal is increased, a transmission loss increases.

To reduce such a transmission loss, it has been proposed that, in a connector in which a base, a base shield layer, a base insulating layer, a conductor layer composed of a plurality of conductors, a cover insulating layer, and a cover shield layer are successfully laminated, the base shield layer and the cover shield layer continuously surround the conductor layer via the base insulating layer and the cover insulating layer to ground the base shield layer with a tab extending from the end of the base shield layer (see, e.g., U.S. Pat. No. 4,926,007).

SUMMARY OF THE INVENTION

In the connector described in U.S. Pat. No. 4,926,007, the tab of the base shield layer is formed on the base, while the terminals of the conductor layer are formed on the base insulating layer. In other words, the tab of the base shield layer and the terminals of the conductor layer are not formed on the same layer so that the respective positions thereof in the thickness direction are different from each other. As a result, when the connector is connected to an electronic device or the like, such connection becomes intricate.

It is therefore an object of the present invention to provide a wired circuit board which can achieve an easy and reliable connection between a signal connecting terminal and an external terminal corresponding thereto and a connection between a ground connecting terminal and an external terminal corresponding thereto.

A wired circuit board according to the present invention comprises a plurality of insulating layers, a conductive layer having a signal wiring extending in a longitudinal direction which is covered with the insulating layers, and a signal connecting terminal provided on a longitudinal end of the signal wiring and exposed from the insulating layers, and a ground layer having a ground wiring covered with the insulating layers and formed to surround the signal wiring in a perpendicular direction to the longitudinal direction, and a ground connecting terminal provided on a longitudinal end of the ground wiring and exposed from the insulating layers, wherein the signal connecting terminal and the ground connecting terminal are formed on an upper surface of the same insulating layer among the plurality of the insulating layers.

In the wired circuit board, the signal connecting terminal and the ground connecting terminal are formed on the upper surface of the same insulating layer among the plurality of the insulating layers. In other words, the signal connecting terminal and the ground connecting terminal are placed at substantially the same positions in the thickness direction. Therefore, it is possible to easily and reliably achieve a connection between the signal connecting terminal and an external terminal corresponding thereto and a connection between the ground connecting terminal and an external terminal corresponding thereto.

In the wired circuit board according to the present invention, it is preferable that the signal wiring and the signal connecting terminal are formed on the upper surface of the same insulating layer, or the ground wiring and the ground connecting terminal are formed on the upper surface of the same insulating layer.

In the wired circuit board, it is possible to simultaneously and easily form the signal wiring and the signal connecting terminal or the ground wiring and the ground connecting terminal. At the same time, it is also possible to easily and reliably achieve the connection between the signal connecting terminal and the external terminal corresponding thereto and the connection between the ground connecting terminal and the external terminal corresponding thereto.

In the wired circuit board according to the present invention, it is preferable that the plurality of the insulating layers comprise at least a first insulating layer formed on a lower surface of the signal wiring, and a second insulating layer formed between a lower surface of the ground wiring and the first insulating layer to cover the signal wiring, and the signal connecting terminal and the ground connecting terminal are formed on an upper surface of the first insulating layer.

In the wired circuit board, both the signal connecting terminal and the ground connecting terminal are formed on the upper surface of the first insulating layer. As a result, the wired circuit board can be formed easily. At the same time, it is also possible to easily and reliably achieve the connection between the signal connecting terminal and the external terminal corresponding thereto and the connection between the ground connecting terminal and the external terminal corresponding thereto.

In the wired circuit board according to the present invention, it is preferable that the plurality of the insulating layers comprise at least a first insulating layer formed on a lower surface of the signal wiring, and a second insulating layer formed between a lower surface of the ground wiring and the first insulating layer to cover the signal wiring, and the signal connecting terminal and the ground connecting terminal are formed on an upper surface of the second insulating layer.

In the wired circuit board, both the signal connecting terminal and the ground connecting terminal are formed on the upper surface of the second insulating layer. As a result, the wired circuit board can be formed easily. At the same time, it is also possible to easily and reliably achieve the connection between the signal connecting terminal and the external terminal corresponding thereto and the connection between the ground connecting terminal and the external terminal corresponding thereto.

BRIEF DESCRIPTION OF THE DRAWINGS

FIG. 9 is a production process view showing the method for producing the wired circuit board shown in FIG. 7, subsequently to FIG. 8, in which a left-side view, a middle view, and a right-side view correspond to the left-side view, middle view, and right-side view of FIG. 7, (c) showing the step of forming a second insulating layer on the upper surface of the first insulating layer to cover the signal wirings, and (d) showing the step of forming first openings in the first insulating layer and the second insulating layer and forming second openings in the second insulating layer; and FIG. 10 is a production process view showing the method for producing the wired circuit board shown in FIG. 7, subsequently to FIG. 9, in which a left-side view, a middle view, and a right-side view correspond to the left-side view, middle view, and right-side view of FIG. 7, (e) showing the step of forming side ground wirings, upper ground wirings, ground connecting terminals, and signal connecting terminals, and (f) showing the step of forming a third insulating layer on the upper surface of the second insulating layer to cover the upper ground wirings and expose the ground connecting terminals and the signal connecting terminals, while forming a fourth insulating layer on the lower surface of the first insulating layer to cover the lower ground wirings.

DETAILED DESCRIPTION OF THE INVENTION

Figure 1:
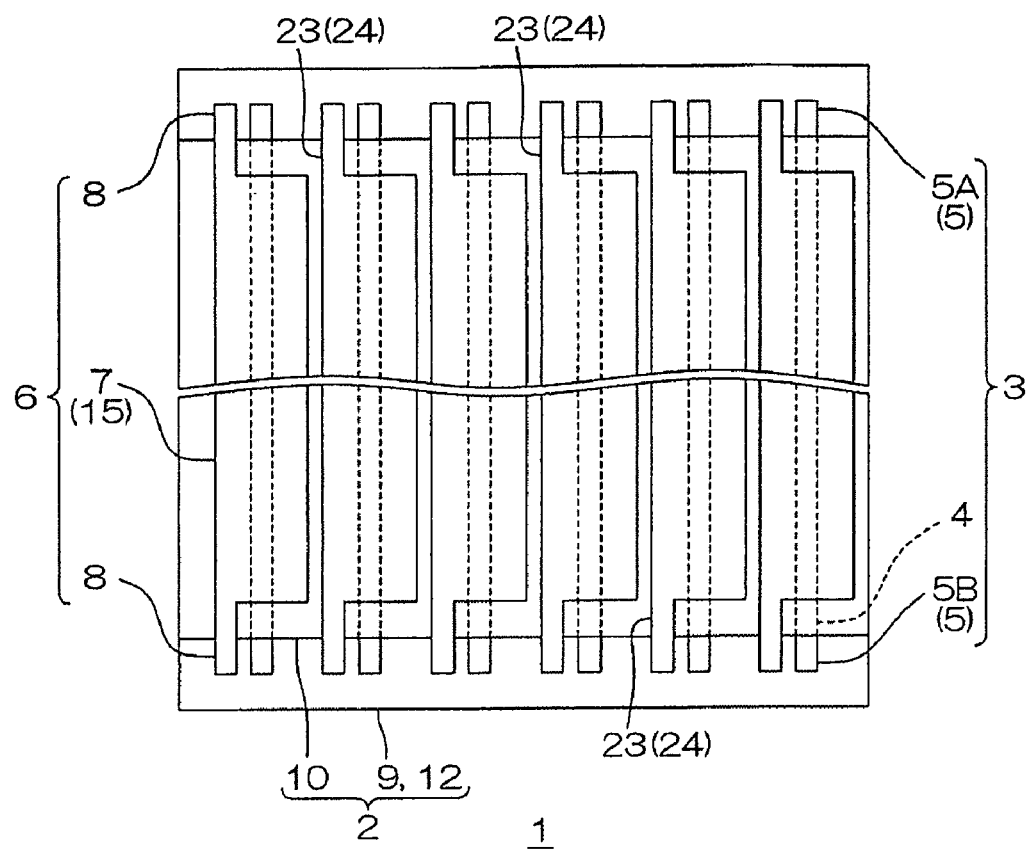
FIG. 1 is a plan view showing a wired circuit board according to an embodiment of the present invention.
Figure 2:
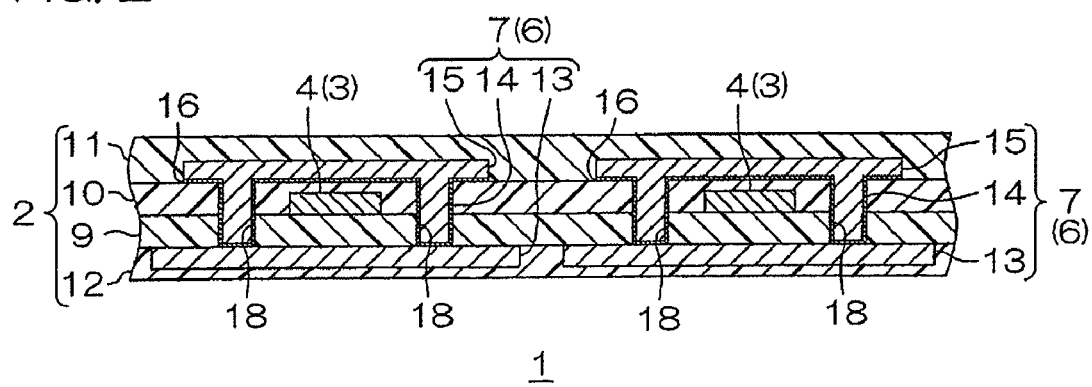
FIG. 2 is a partial cross-sectional view of a longitudinally middle portion of the wired circuit board shown in FIG. 1 along a widthwise direction.
Figure 3:
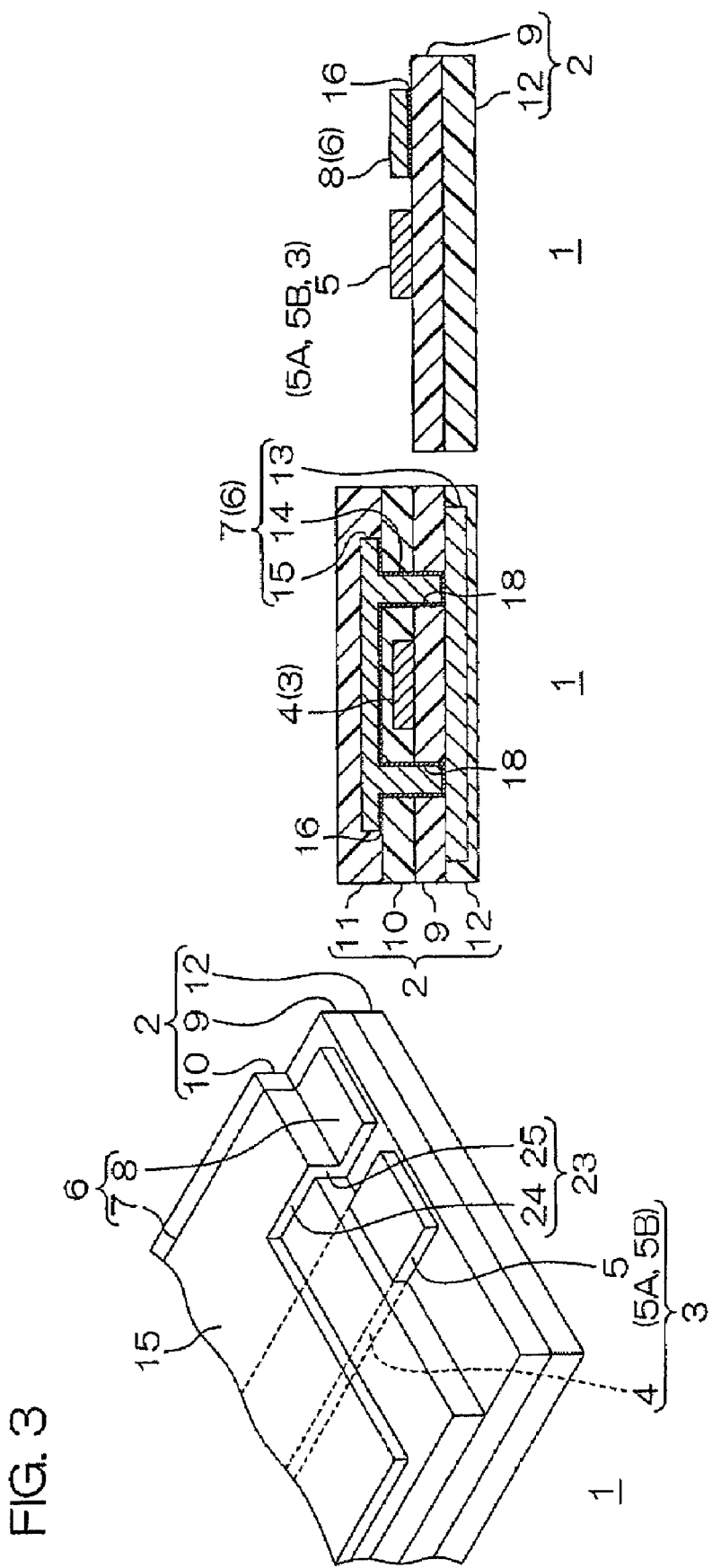
FIG. 3 is a view of each of a conductive layer and a ground layer in the wired circuit board shown in FIG. 2, in which a left-side view is a partial perspective view of one longitudinal end, a middle view is a partial cross-sectional view of the longitudinally middle portion along the widthwise direction, and a right-side view is a partial cross-sectional view of the one longitudinal end along the widthwise direction.
Figure 4:
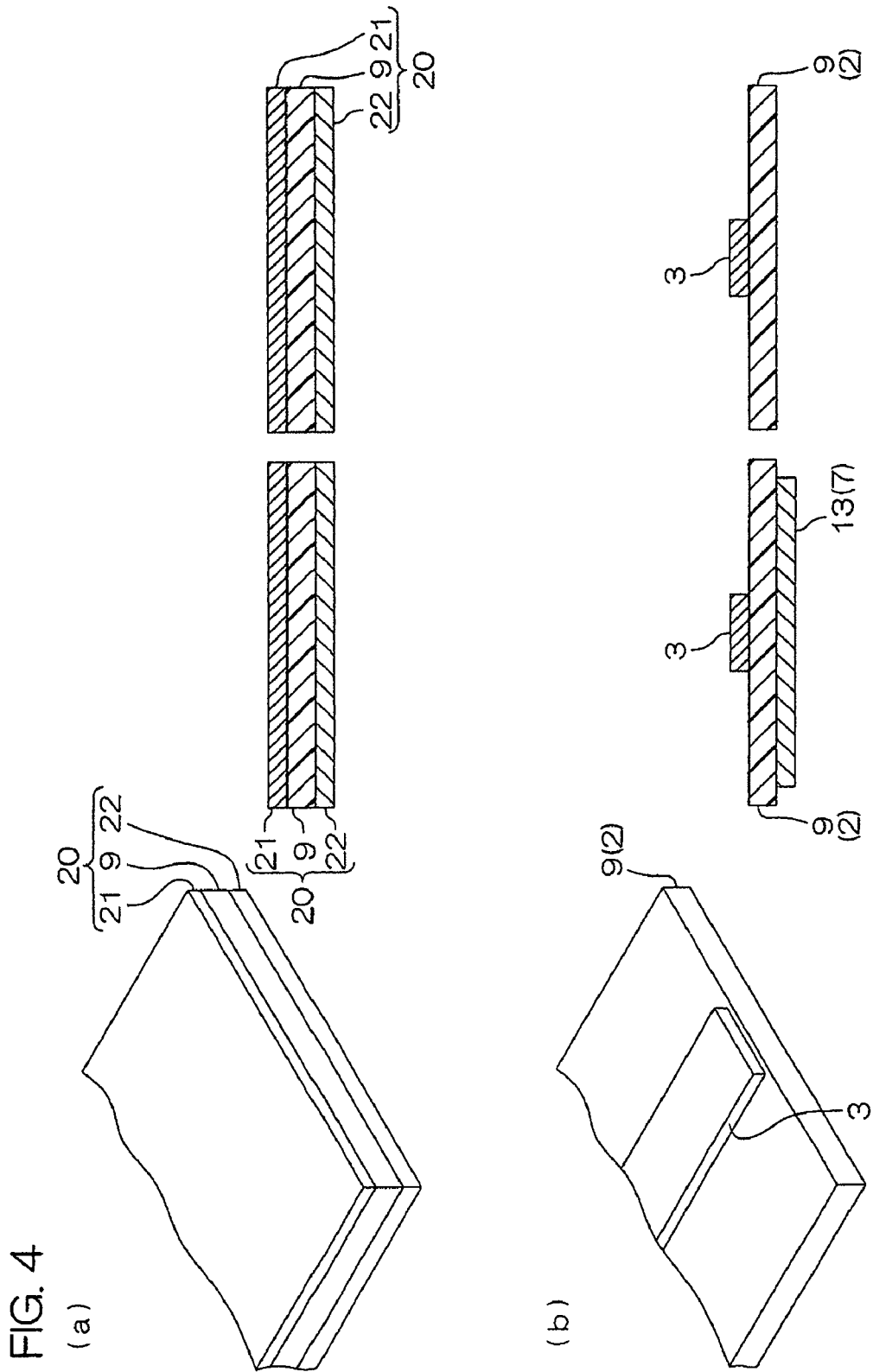
FIG. 4 is a production process view showing a method for producing the wired circuit board shown in FIG. 3, in which a left-side view, a middle view, and a right-side view correspond to the left-side view, middle view, and right-side view of FIG. 3, (a) showing the step of preparing a metal-clad laminated base material in which a first metal layer and a second metal layer are laminated on both sides of a first insulating layer, and (b) showing the step of forming the conductive layer on the upper surface of the first insulating layer and forming lower ground wirings on the lower surface of the first insulating layer.
Figure 5:
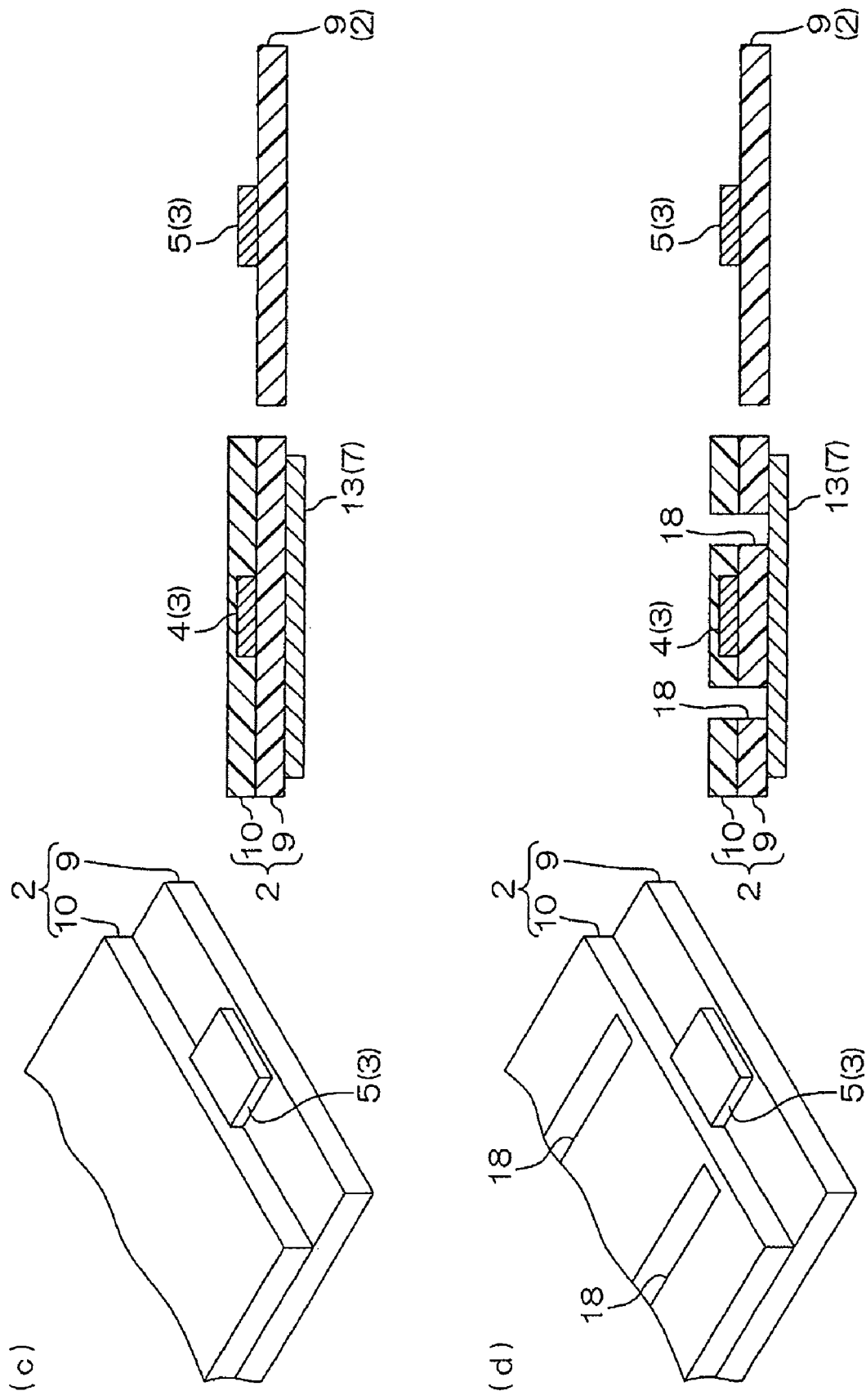
FIG. 5 is a production process view showing the method for producing the wired circuit board shown in FIG. 3, subsequently to FIG. 4, in which a left-side view, a middle view, and a right-side view correspond to the left-side view, middle view, and right-side view of FIG. 3, (c) showing the step of forming a second insulating layer on the upper surface of the first insulating layer to cover the signal wirings of the conductive layer and expose the signal connecting terminals of the conductive layer, and (d) showing the step of forming first openings in the first insulating layer and the second insulating layer.
Figure 6:
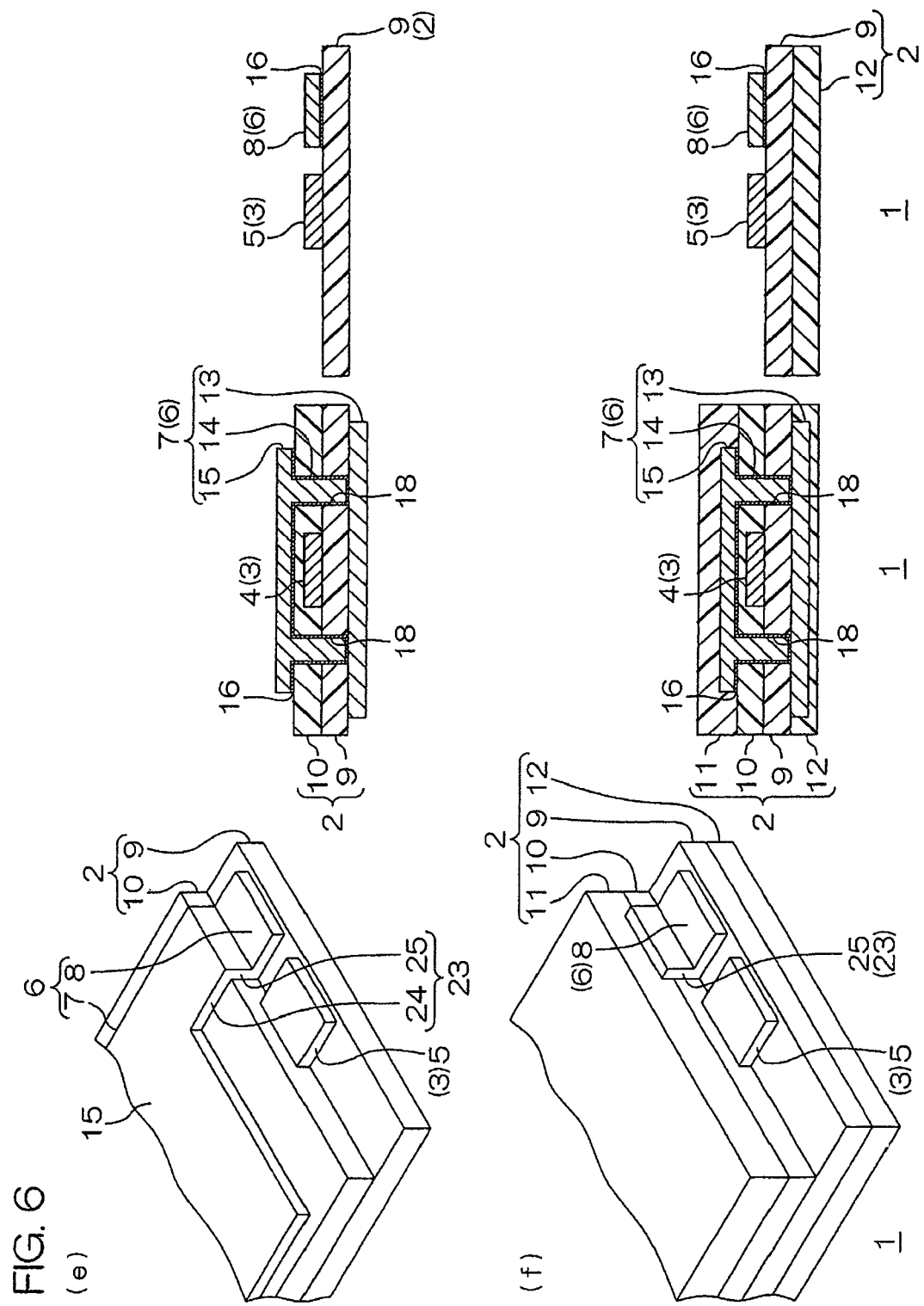
FIG. 6 is a production process view showing the method for producing the wired circuit board shown in FIG. 3, subsequently to FIG. 5, in which a left-side view, a middle view, and a right-side view correspond to the left-side view, middle view, and right-side view of FIG. 3, (e) showing the step of forming side ground wirings, upper ground wirings, ground connecting terminals, and auxiliary ground wirings, and (f) showing the step of forming a third insulating layer on the upper surface of the second insulating layer to cover the upper ground wirings and the upper wirings of the auxiliary ground wirings, while forming a fourth insulating layer on the lower surface of the first insulating layer to cover the lower ground wirings.

FIG. 1 is a plan view showing a wired circuit board according to an embodiment of the present invention. FIG. 2 is a partial cross-sectional view of a middle portion in a longitudinal direction of the wired circuit board (hereinafter simply referred to as the longitudinal direction) shown in FIG. 1 along a perpendicular direction (hereinafter simply referred to as the widthwise direction) to the longitudinal direction and to a thickness direction. FIG. 3 is a view of each of a conductive layer and a ground layer in the wired circuit board shown in FIG. 2, in which a left-side view is a partial perspective view of one longitudinal end, a middle view is a partial cross-sectional view of the longitudinally middle portion along the widthwise direction, and a right-side view is a partial cross-sectional view of the one longitudinal end along the widthwise direction. FIGS. 4 to 6 are production process views showing a method for producing the wired circuit board shown in FIG. 3, in each of which a left-side view, a middle view, and a right-side view correspond to the left-side view, middle view, and right-side view of FIG. 3. In the left-side views of FIGS. 1 and 3, a third insulating layer 11, described later, is omitted. In the left-side views of FIGS. 1, 3, and 4 to 6, a metal thin film 16, described later, is omitted.

In FIG. 1, a wired circuit board 1 is a flexible wired circuit board formed in, e.g., a generally rectangular shape extending in the longitudinal direction when viewed in plan view. The wired circuit board 1 includes, e.g., insulating layers 2, a conductive layer 3, and a ground layer 6.

Each of the insulating layers 2 is formed in a generally rectangular shape extending in the longitudinal direction when viewed in plan view to correspond to the outer shape of the wired circuit board 1. As shown in FIG. 2, the insulating layers 2 include a first insulating layer 9, a second insulating layer 10, a third insulating layer 11, and a fourth insulating layer 12. The insulating layers 2 are formed by successively laminating the second insulating layer 10 and the third insulating layer 11 on the first insulating layer 9 and laminating the fourth insulating layer 12 under the first insulating layer 9.

The first insulating layer 9, the second insulating layer 10, the third insulating layer 11, and the fourth insulating layer 12 are formed to have respective both end edges in the widthwise direction placed at the same positions when viewed in plan view.

As shown in FIGS. 1 and 6(f), the first insulating layer 9 and the fourth insulating layer 12 are formed to have respective both end edges in the longitudinal direction placed at the same positions when viewed in plan view. The second insulating layer 10 and the third insulating layer 11 are formed to have respective both end edges in the longitudinal direction placed at the same positions.

The second insulating layer 10 and the third insulating layer 11 are formed to be slightly shorter in the longitudinal direction than the first insulating layer 9 and the fourth insulating layer 12. In other words, the second insulating layer 10 and the third insulating layer 11 are formed to expose the both longitudinal ends of the first insulating layer 9 and the fourth insulating layer 12 from both of the longitudinal end edges of the second insulating layer 10 and the third insulating layer 11.

The second insulating layer 10 is formed on the upper surface of the first insulating layer 9 to cover the signal wirings 4, described later, of the conductive layer 3. The second insulating layer 10 is formed between the first insulating layer 9 and the lower surfaces of upper ground wirings 15, described later.

In the first insulating layer 9 and the second insulating layer 10, two first openings 18 are formed for each of the signal wirings 4 to be arranged in widthwise spaced-apart relation with the signal wiring 4 interposed therebetween to penetrate in the thickness direction, and to extend in the longitudinal direction. Each of the first openings 18 is filled with respective side ground wirings 14, described later.

The third insulating layer 11 is formed on the upper surface of the second insulating layer 10 to cover the upper ground wirings 15, described later.

The fourth insulating layer 12 is formed on the lower surface of the first insulating layer 9 to cover lower ground wirings 13, described later.

The first insulating layer 9, the second insulating layer 10, the third insulating layer 11, and the fourth insulating layer 12 are made of the same insulating material or different insulating materials. For example, the first insulating layer 9, the second insulating layer 10, the third insulating layer 11, and the fourth insulating layer 12 are made of synthetic resins (e.g., photosensitive synthetic resins when the first insulating layer 9, the second insulating layer 10, the third insulating layer 11, and the fourth insulating layer 12 are formed in a pattern in a production method described later) such as polyimide, polyether nitrile, polyether sulfone, polyethylene terephtalate, polyethylene naphthalate, and polyvinyl chloride. Preferably, the first insulating layer 9, the second insulating layer 10, the third insulating layer 11, and the fourth insulating layer 12 are made of polyimide.

The thickness of the first insulating layer 9 is in the range of, e.g., 5 to 50 µm, or preferably 12 to 30 µm. The thickness of the second insulating layer 10 is in the range of, e.g., 5 to 50 µm, or preferably 12 to 30 µm. The thickness of the third insulating layer 11 is in the range of, e.g., 5 to 50 µm, or preferably 12 to 30 µm. The thickness of the fourth insulating layer 12 is in the range of, e.g., 5 to 50 µm, or preferably 12 to 30 µm.

As shown in FIG. 1, the conductive layer 3 is formed in a wired circuit pattern integrally including the plurality of signal wirings 4, one-side signal connecting terminals 5A provided on one side in the longitudinal direction of the signal wirings 4, and other-side signal connecting terminals 5B provided on the other side in the longitudinal direction of the signal wirings 4.

The plurality of signal wirings 4 are arranged in mutually spaced-apart and parallel relation in the widthwise direction. Each of the signal wirings 4 is formed on the upper surface of the first insulating layer 9 to extend in the longitudinal direction, and to be covered with the second insulating layer 10.

The one-side signal connecting terminals 5A and the other-side signal connecting terminals 5B are formed on the upper surface of the first insulating layer 9 to be disposed at the both longitudinal ends of the wired circuit board 1, and to expose from the second insulating layer 10 and the third insulating layer 11. More specifically, the one-side signal connecting terminals 5A and the other-side signal connecting terminals 5B are arranged on the upper surface of the first insulating layer 9 exposed from the respective both longitudinal end edges of the second insulating layer 10 and the third insulating layer 11 in parallel and mutually spaced-apart relation. In addition, the one-side signal connecting terminals 5A and the other-side signal connecting terminals 5B are arranged to have respective both longitudinal end edges thereof longitudinally inwardly spaced apart from the respective both longitudinal end edges of the first insulating layer 9 and the fourth insulating layer 12 (see FIG. 6 (f)).

The one-side signal connecting terminals 5A and the other-side signal connecting terminals 5B are connected continuously to the both longitudinal ends of the respective signal wirings 4. To each of the one-side signal connecting terminals 5A and the other-side signal connecting terminals 5B, the connector (external terminal) of an electronic component corresponding thereto, not shown, is connected.

In the description given below, the one-side signal connecting terminals 5A and the other-side signal connecting terminals 5B are collectively referred to as signal connecting terminals 5. In FIGS. 3 to 10, either the one-side signal connecting terminals 5A or the other-side signal connecting terminals 5B are shown.

The conductive layer 3 is made of a conductive material such as copper, nickel, gold, a solder, or an alloy thereof. Preferably, the conductive layer 3 is made of copper.

The thickness of the conductive layer 3 is in the range of, e.g., 3 to 18 µm, or preferably 5 to 12 µm. The width (widthwise length, hereinafter referred to as such) of each of the signal wirings 4 is in the range of, e.g., 20 to 75 µm, or preferably 35 to 55 µm. The spacing between the individual signal wirings 4 is in the range of, e.g., 200 to 800 µm, or preferably 400 to 600 µm. The length (longitudinal length, hereinafter referred to as such) of each of the signal connecting terminals 5 is in the range of, e.g., 3 to 200 mm, or preferably 50 to 100 mm.

As shown in FIGS. 1 and 3, the ground layer 6 includes a plurality of ground wirings 7 covered with the insulating layers 2 and ground connecting terminals 8 connected to the respective both longitudinal ends of the ground wirings 7 and exposed from the insulating layers 2.

The ground wirings 7 are provided to correspond to the respective signal wirings 4 and extend in the longitudinal direction. As shown in FIG. 2, each of the ground wirings 7 includes a lower ground wiring 13, a side ground wiring 14, and an upper ground wiring 15.

The lower ground wirings 13 are formed each in a generally rectangular shape when viewed in plan view on the lower surface of the first insulating layer 9 to be covered with the fourth insulating layer 12.

Each of the lower ground wirings 13 is formed at least to oppose in the thickness direction to the corresponding signal wiring 4 and the two side ground wirings 14 having the signal wiring 4 interposed therebetween. More specifically, each of the lower ground wirings 13 is formed to extend to both outsides of the corresponding signal wiring 4, and to be wider than the spacing between the both widthwise outer side surfaces (the one widthwise side surface of the side ground wiring 14 on one widthwise side and the other widthwise side surface of the side ground wiring 14 on the other widthwise side) of the two side ground wirings 14 corresponding thereto.

The side ground wirings 14 are formed each in a generally rectangular shape when viewed in side view to fill in the first openings 18 of the first insulating layer 9 and the second insulating layer 10.

The side ground wirings 14 are arranged in spaced-apart relation on both widthwise outsides of each of the signal wirings 4. The side ground wirings 14 are arranged to oppose to each other with the signal wiring 4 interposed therebetween in the widthwise direction.

The upper ground wirings 15 are formed each in a generally rectangular shape when viewed in plan view on the upper surface of the second insulating layer 10 to be covered with the third insulating layer 11.

Each of the upper ground wirings 15 is formed in integral and continuous relation to the two side ground wirings 14 corresponding thereto. More specifically, each of the upper ground wirings 15 is formed to oppose in the thickness direction to the corresponding signal wiring 4 and to the corresponding lower ground wiring 13, and to protrude from the respective upper ends of the two side ground wirings 14 upwardly in the thickness direction, and inwardly and outwardly in both widthwise directions.

As shown in FIG. 3, an auxiliary ground wiring 23, described later, is connected continuously and integrally to each of the upper ground wirings 15.

The lower ground wirings 13, the side ground wirings 14, and the upper ground wirings 15 are made of the same metal material or different metal materials. For example, the lower ground wirings 13, the side ground wirings 14, and the upper ground wirings 15 are made of the same metal material as used to form the conductive layer 3. Preferably, the lower ground wirings 13, the side ground wirings 14, and the upper ground wirings 15 are made of copper.

The thickness of each of the lower ground wirings 13 is in the range of, e.g., 3 to 18 μm, or preferably 5 to 12 μm. The width of each of the lower ground wirings 13 is in the range of, e.g., 150 to 500 μm, or preferably 220 to 430 μm. The spacing between the individual lower ground wirings 13 is in the range of, e.g., 80 to 300 μm, or preferably 100 to 200 μm.

The width of each of the side ground wirings 14 is in the range of, e.g., 3 to 18 μm, or preferably 5 to 12 μm. The spacing between the two side ground wirings 14 having each of the signal wirings 4 interposed therebetween is in the range of, e.g., 100 to 500 μm, or preferably 180 to 250 μm. The spacing between each of the side ground wirings 14 and the signal wiring 4 corresponding thereto is in the range of, e.g., 10 to 100 μm, or preferably 30 to 60 μm.

The thickness of each of the upper ground wirings 15 is in the range of, e.g., 3 to 18 μm, or preferably to 12 μm. The width of each of the upper ground wirings 15 is in the range of, e.g., 150 to 500 μm, or preferably 220 to 430 μm. The spacing between the individual upper ground wirings 15 is in the range of, e.g., 80 to 300 μm, or preferably 100 to 200 μm.

The ground wirings 7 are formed such that each of the signal wirings 4 is interposed between the corresponding lower ground wiring 13 and the corresponding upper ground wiring 15 in the thickness direction and that each of the signal wirings 4 is interposed between the corresponding two side ground wirings 14 in the widthwise direction. As a result, the ground wirings 7 surround the respective signal wirings 4 in the widthwise direction and in the thickness direction.

As shown in FIG. 1, each of the ground wirings 7 has both of the longitudinal ends thereof disposed longitudinally inwardly of the respective both longitudinal ends of the second insulating layer 10 and the third insulating layer 11.

As shown in FIGS. 1 and 3, the ground connecting terminals 8 are provided at both of the longitudinal ends of wired circuit board 1 and formed each in a generally rectangular shape when viewed in plan view on the upper surface of the first insulating layer 9. More specifically, the ground connecting terminals 8 are arranged in mutually spaced-apart and parallel relation on the upper surface of the first insulating layer 9 exposed from the respective both longitudinal end edges of the second insulating layer 10 and the third insulating layer 11. Each of the ground connecting terminals 8 is ground-connected (grounded) to the connector (external terminal) of an electronic component not shown. The ground connecting terminals 8 are continuously and integrally provided with the respective auxiliary ground wirings 23.

Each of the auxiliary ground wirings 23 is disposed at both of the longitudinal ends of the second insulating layer 10 to have a generally L-shape when viewed in side view. Each of the auxiliary ground wirings 23 integrally includes an upper wiring 24 continued to the corresponding upper ground wiring 15 and a side wiring 25 continued to the corresponding ground connecting terminal 8.

Each of the upper wirings 24 is formed on the upper surface of the second insulating layer 10 to extend from the one widthwise end of the one longitudinal end edge of the corresponding upper ground wiring 15 in one longitudinal direction. Each of the upper wirings 24 is covered with the third insulating layer 11 (see FIG. 6(f)).

Each of the side wirings 25 is formed on the one longitudinal side surface of the second insulating layer 10 to extend upwardly in the thickness direction from the other longitudinal end edge (the portion adjacent to the one longitudinal side surface of the second insulating layer 10) of the corresponding ground connecting terminal 8, and is continued to the corresponding upper wiring 24. As shown in FIG. 6(f), each of the side wirings 25 is exposed from the third insulating layer 11.

The auxiliary ground wirings 23 electrically connect the respective upper ground wirings 15 and the respective ground connecting terminals 8.

The ground connecting terminals 8 and the auxiliary ground wirings 23 are made of the same metal material as used to form the upper ground wirings 15. Preferably, the ground connecting terminals 8 and the auxiliary ground wirings 23 are made of copper.

The thickness of each of the ground connecting terminals 8 and the auxiliary ground wirings 23 is the same as that of each of the upper ground wirings 15, or preferably in the range of 5 to 12 μm. The respective widths of the ground connecting terminals 8 and the auxiliary ground wirings 23 are, e.g., the same and in the range of, e.g., 200 to 1500 μm, or preferably 250 to 500 μm. The length of each of the ground connecting terminals 8 is in the range of, e.g., 2 to 15 mm, or preferably 3 to 10 mm.

When the side ground wirings 14, the upper ground wirings 15, the ground connecting terminals 8, and the auxiliary ground wirings 23 are formed by an additive method, described later, metal thin films 16 are formed on the respective lower surfaces or side surfaces thereof. More specifically, the respective metal thin films 16 are interposed between the side ground wirings 14 and each of the upper surfaces of the lower ground wirings 13 and the inner side surfaces of the first openings 18, between the upper ground wirings 15 and the upper surface of the second insulating layer 10, between the ground connecting terminals 8 and the upper surface of the first insulating layer 9, between the respective upper wirings 24 of the auxiliary ground wirings 23 and the upper surface of the second insulating layer 10, and between the respective side wirings 25 of the auxiliary ground wirings 23 and the one longitudinal end surface of the second insulating layer 10.

Each of the metal thin films 16 is made of copper, chromium, gold, silver, platinum, nickel, titanium, silicon, manganese, zirconium, an alloy thereof, or an oxide thereof. Preferably, the metal thin film 16 is made of copper and chromium. The thickness of the metal thin film 16 is in the range of, e.g., 0.01 to 1 μm, or preferably 0.01 to 0.1 μm.

Next, a description is given to a method for producing the wired circuit board 1 with reference to FIGS. 4-6.

First, as shown in FIG. 4(a), a metal-clad laminated base material (such as a copper-clad laminated base material) 20 in which a first metal layer 21 is preliminarily laminated on the upper surface of the first insulating layer 9, and a second metal layer 22 is preliminarily laminated on the lower surface of the first insulating layer 9 is prepared in the method.

Then, as shown in FIG. 4(b), the conductive layer 3 is formed on the upper surface of the first insulating layer 9 by, e.g., a subtractive method, while the lower ground wirings 13 are formed on the lower surface of the first insulating layer 9.

In the subtractive method, e.g., a dry film resist, not shown, is laminated on the first metal layer 21, exposed to light, and developed to form an etching resist, not shown, in the same pattern as the wired circuit pattern of the conductive layer 3, while a dry film resist, not shown, is laminated under the second metal layer 22, exposed to light, and developed to form an etching resist, not shown, in the same pattern as that of the lower ground wirings 13. Subsequently, wet etching is performed with respect to the first metal layer 21 and the second metal layer 22 exposed from the respective etching resists. Thereafter, the etching resists are removed.

Then, as shown in FIG. 5(c), the second insulating layer 10 is formed on the upper surface of the first insulating layer 9 to cover the signal wirings 4 of the conductive layer 3 and expose the signal connecting terminals 5 of the conductive layer 3.

The second insulating layer 10 is formed in the foregoing pattern by, e.g., coating a varnish of a photosensitive synthetic resin on the upper surface of the first insulating layer 9 including the conductive layer 3, drying it, exposing it to light via a photomask, developing it, and then curing it as necessary.

Then, as shown in FIG. 5(d), each of the first openings 18 is formed in the foregoing shape in the first insulating layer 9 and the second insulating layer 10.

The first openings 18 are formed by, e.g., dry etching using a plasma or a laser, or preferably the dry etching using a laser.

Then, as shown in FIG. 6(e), the side ground wirings 14, the upper ground wirings 15, the ground connecting terminals 8, and the auxiliary ground wirings 23 are formed simultaneously.

The side ground wirings 14, the upper ground wirings 15, the ground connecting terminals 8, and the auxiliary ground wirings 23 are formed in the foregoing pattern by, e.g., the additive method or a printing method using a conductive paste.

In the additive method, the metal thin film 16 is first formed continuously on the upper surface and both longitudinal side surfaces of the second insulating layer 10, on the upper surface of the first insulating layer 9, on the upper surfaces, both widthwise side surfaces, and both longitudinal side surfaces of the signal connecting terminals 5, on the inner side surfaces of the first openings 18, and on the upper surfaces of the lower ground wirings 13 exposed from the first openings 18. The metal thin film 16 is formed by sputtering, or preferably laminating a chromium thin film and a copper thin film by chromium sputtering and copper sputtering.

Then, a plating resist, not shown, is formed in a pattern reverse to the foregoing pattern on the upper surface and side surfaces of the metal thin film 16. Subsequently, the side ground wirings 14, the upper ground wirings 15, the ground connecting terminals 8, and the auxiliary ground wirings 23 are simultaneously formed by electrolytic plating in the foregoing pattern on the upper surface and side surfaces of the metal thin film 16 exposed from the plating resist. Thereafter, the plating resist and the portion of the metal thin film 16 where the plating resist is laminated are removed.

In the printing method using a conductive paste, the side ground wirings 14, the upper ground wirings 15, the ground connecting terminals 8, and the auxiliary ground wirings 23 are simultaneously formed by, e.g., screen-printing the conductive paste to the upper surface and both longitudinal side surfaces of the second insulating layer 10 including the first openings 18 and to the upper surface of the first insulating layer 9 and sintering the conductive paste. An example of the conductive paste may include a conductive paste containing fine particles of any of the metal materials mentioned above, preferably a copper paste containing copper fine particles, or the like. In the printing method using the conductive paste, the side ground wirings 14, the upper ground wirings 15, the ground connecting terminals 8, and the auxiliary ground wirings 23 can be formed in the foregoing pattern at low cost.

In this manner, the side ground wirings 14, the upper ground wirings 15, the ground connecting terminals 8, and the auxiliary ground wirings 23 can be formed simultaneously.

Then, as shown in FIG. 6(f), the third insulating layer 11 is formed on the upper surface of the second insulating layer 10 to cover the upper ground wirings 15 and the upper wirings 24 of the auxiliary ground wirings 23, while the fourth insulating layer 12 is formed on the lower surface of the first insulating layer 9 to cover the lower ground wirings 13.

The third insulating layer 11 is formed in the foregoing pattern by, e.g., coating a varnish of a photosensitive synthetic resin on the upper surface of the second insulating layer 10 including the upper ground wirings 15 and the auxiliary ground wirings 23, drying it, exposing it to light via a photomask, developing it, and then curing it as necessary.

The fourth insulating layer 12 is formed in the foregoing pattern by, e.g., coating a varnish of a photosensitive synthetic resin on the lower surface of the first insulating layer 9 including the lower ground wirings 13, drying it, exposing it to light via a photomask, developing it, and then curing it as necessary.

The formation of the third insulating layer 11 is not limited to the method shown above. For example, it is also possible to preliminarily form a synthetic resin into a film in the foregoing pattern and sticking the film to the upper surface of the second insulating layer 10 including the upper ground wirings 15 and the auxiliary ground wirings 23 via a known adhesive layer.

The formation of the fourth insulating layer 12 is not limited to the method shown above. For example, it is also possible to preliminarily form a synthetic resin into a film in the foregoing pattern and sticking the film to the lower surface of the first insulating layer 9 including the lower ground wirings 13 via a known adhesive layer.

In the wired circuit board 1, the signal connecting terminals 5 and the ground connecting terminals 8 are formed on the upper surface of the same insulating layer among the insulating layers 2, i.e., the first insulating layer 9.

In other words, the signal connecting terminals 5 and the ground connecting terminals 8 are placed at substantially the same positions in the thickness direction. Accordingly, it is possible to easily and reliably achieve connections between the signal connecting terminals 5 and the connectors of electronic components corresponding thereto and connections between the ground connecting terminals 8 and the connectors of electronic components corresponding thereto.

In addition, in the wired circuit board 1, the signal wirings 4 and the signal connecting terminals 5 are formed on the upper surface of the same insulating layer, i.e., the first insulating layer 9. Accordingly, the signal wirings 4 and the signal connecting terminals 5 can be formed simultaneously and easily in the foregoing pattern from the metal-clad laminated base material 20 mentioned above by the subtractive method.

Since both the signal connecting terminals 5 and the ground connecting terminals 8 are formed on the upper surface of the first insulating layer 9, the wired circuit board 1 can be formed easily.

In the description given above, the ground connecting terminals 8 are provided at the both longitudinal ends of the wired circuit board 1. However, the present invention is not limited thereto. For example, it is also possible to provide the ground connecting terminals 8 at the one longitudinal end of the wired circuit board 1, though not shown.

In the description given above, the signal connecting terminals 5 and the ground connecting terminals 8 are formed on the upper surface of the first insulating layer 9. However, the present invention is not limited thereto. For example, it is also possible to form the signal connecting terminals 5 and the ground connecting terminals 8 on the upper surface of the second insulating layer 10.

Next, a wired circuit board according to another embodiment of the present invention is described with reference to FIGS. 7 to 10. In FIGS. 7 to 10, the members corresponding to the individual members described above are designated by the same reference numerals as used above and the detailed description thereof is omitted. In the left-side view of FIG. 7, the third insulating layer 11 is omitted. In the left-side views of FIGS. 7 to 10, the metal thin film 16 is omitted.

Figure 7:
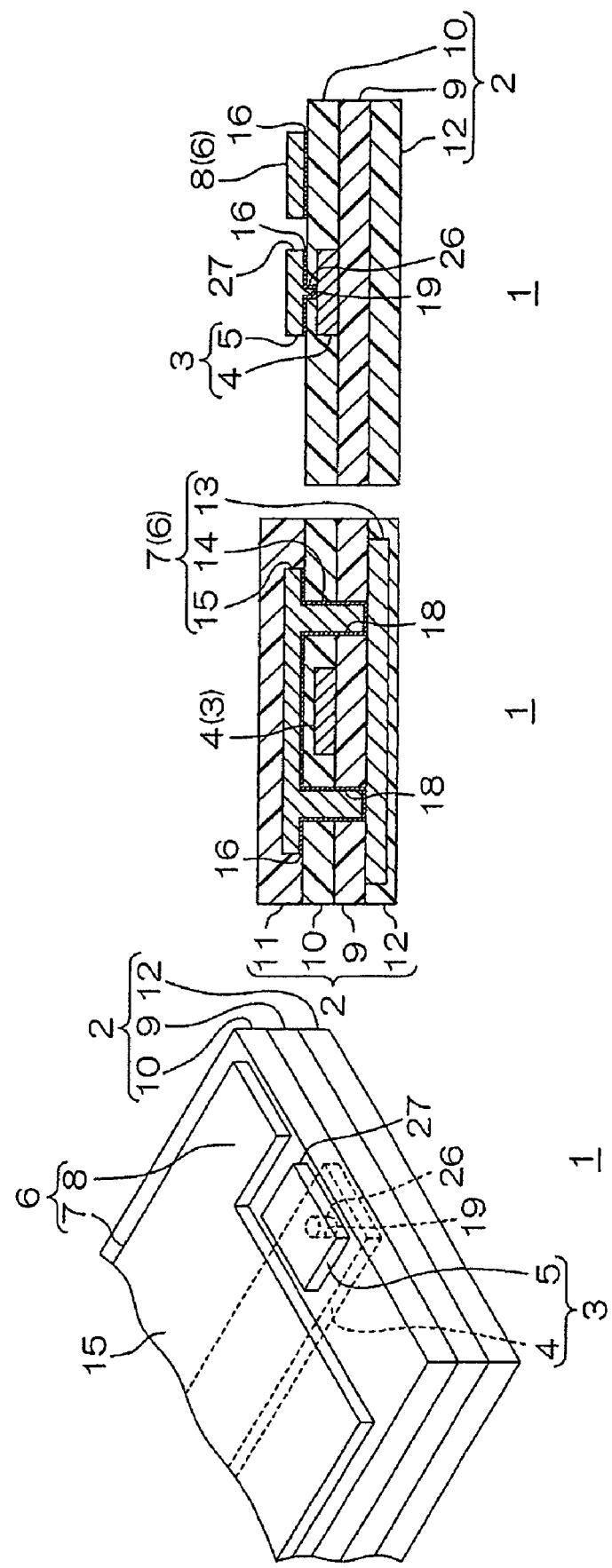
FIG. 7 is a view of each of a conductive layer and a ground layer in a wired circuit board according to another embodiment of the present invention, in which a left-side view is a partial perspective view of one longitudinal end, a middle view is a partial cross-sectional view of a longitudinally middle portion along the widthwise direction, and a right-side view is a partial cross-sectional view of the one longitudinal end along the widthwise direction.

In FIG. 7, in the insulating layers 2 of the wired circuit board 1, the first insulating layer 9, the second insulating layer 10, and the fourth insulating layer 12 are formed to have the respective both end edges in the longitudinal direction placed at the same positions when viewed in plan view.

As shown in FIG. 10(f), the third insulating layer 11 is formed to be slightly shorter in the longitudinal direction than the first insulating layer 9, the second insulating layer 10, and the fourth insulating layer 12. In other words, the first insulating layer 9, the second insulating layer 10, and the fourth insulating layer 12 are formed to expose the respective both longitudinal ends of the first insulating layer 9, the second insulating layer 10, and the fourth insulating layer 12 from the both longitudinal end edges of the third insulating layer 11.

As shown in FIG. 7, in the second insulating layer 10, second openings 19 are formed at the generally center portion in the longitudinal direction of the second insulating layer 10 exposed from the third insulating layer 11 and at the generally center portion in the widthwise direction of the corresponding signal wiring 4 to penetrate in the thickness direction.

The second openings 19 are via holes for electrically connecting the signal connecting terminals 5, described in detail later, and the respective signal wirings 4. The plurality of second openings 19 are provided to correspond to the signal wirings 4 and each formed in a cylindrical shape to partially expose the upper surfaces of the both longitudinal ends of the corresponding signal wiring 4. The second openings 19 are filled with the lower portions 26 of the signal connecting terminals 5, described later.

Each of the signal wirings 4 is formed to be covered with the second insulating layer 10, except for the second openings 19. The signal wirings 4 are also formed to extend to the both longitudinal ends of the insulating layers 2, and to have the both longitudinal end edges thereof placed at the generally same positions as the both longitudinal end edges of the signal connecting terminals 5, described next, when viewed in plan view.

The signal connecting terminals 5 are formed on the upper surface of the second insulating layer 10 and disposed at the both longitudinal ends of the wired circuit board 1. More specifically, as shown in FIG. 10(f), each of the signal connecting terminals 5 has the other longitudinal end edge thereof disposed to be spaced apart from the one longitudinal end edge of the third insulating layer 11 in one longitudinal direction.

As shown in FIG. 7, each of the signal connecting terminals 5 integrally includes the lower portion 26 formed to fill in the corresponding second opening 19 and an upper portion 27 formed in a generally rectangular shape when viewed in plan view to protrude from the upper end of the lower portion 26 upwardly in the thickness direction and outwardly in both widthwise directions and in both longitudinal directions, and to cover the upper surface of the second insulating layer 10 around the second opening 19. The lower portion 26 of each of the signal connecting terminals 5 is in contact with the upper surface of the corresponding signal wiring 4.

When the signal connecting terminals 5 are formed by the additive method, described later, the metal thin films 16 are formed between the lower portions 26 and each of the upper surfaces of the signal wirings 4 exposed from the second openings 19 and the inner side surfaces of the second openings 19 and between the upper portions 27 and the upper surface of the second insulating layer 10 covered with the upper portions 27.

The width of the upper portion 27 of each of the signal connecting terminals 5 is in the range of, e.g., 200 to 1500 μm, or preferably 250 to 500 μm. The length of the upper portion 27 of each of the signal connecting terminals 5 is in the range of, e.g., 2 to 15 mm, or preferably 3 to 10 mm. The spacing between the respective upper portions 27 of the signal connecting terminals 5 is in the range of, e.g., 100 to 1000 μm, or preferably 200 to 700 μm. The thickness of the lower portion 26 of each of the signal connecting terminals 5 is in the range of, e.g., 2 to 22 μm, or preferably 5 to 15 μm. The diameter of the lower portion 26 of each of the signal connecting terminals 5 is in the range of, e.g., 50 to 300 μm, or preferably 75 to 150 μm.

As shown in FIG. 10(f), the ground connecting terminals 8 are provided on the upper surface of the second insulating layer 10 to expose from the third insulating layer 11. As shown in FIG. 7, the ground connecting terminals 8 are connected continuously to the one widthwise ends of the one longitudinal end edges of the upper ground wirings 15. In other words, the ground connecting terminals 8 are not provided with the auxiliary ground wirings 23 described above so that the ground connecting terminals 8 and the upper ground wirings 15 are connected directly to each other.

The width of each of the ground connecting terminals 8 is in the range of, e.g., 200 to 1500 μm, or preferably 250 to 500 μm. The length of each of the ground connecting terminals 8 is in the range of, e.g., 2 to 15 mm, or preferably 3 to 10 mm. The spacing between the individual ground terminals 8 is in the range of, e.g., 0.1 to 1.0 mm, or preferably 0.2 to 0.7 mm.

Figure 8:
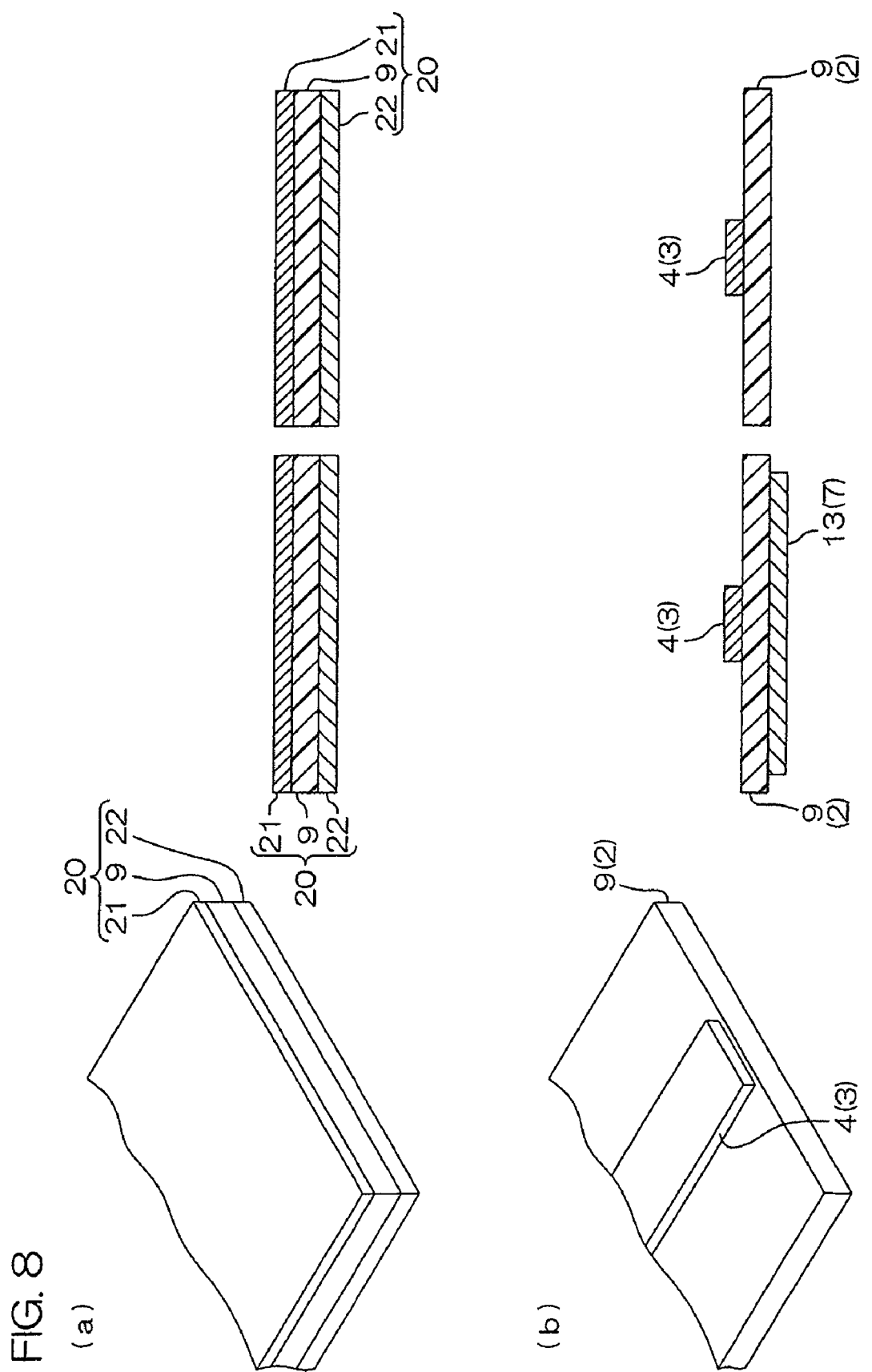
FIG. 8 is a production process view showing a method for producing the wired circuit board shown in FIG. 7, in which a left-side view, a middle view, and a right-side view correspond to the left-side view, middle view, and right-side view of FIG. 7, (a) showing the step of preparing a metal-clad laminated base material in which a first metal layer and a second metal layer are laminated on both sides of a first insulating layer, and (b) showing the step of forming signal wirings on the upper surface of the first insulating layer and forming lower ground wirings on the lower surface of the first insulating layer.

Next, a description is given to a method for producing the wired circuit board 1 with reference to FIGS. 8-10.

First, as shown in FIG. 8(*a*), the metal-clad laminated base material 20 is prepared in the method.

Then, as shown in FIG. 8(*b*), the signal wirings 4 are formed on the upper surface of the first insulating layer 9 by, e.g., a subtractive method, while the lower ground wirings 13 are formed on the lower surface of the first insulating layer 9.

Then, as shown in FIG. 9(*c*), the second insulating layer 10 is formed on the upper surface of the first insulating layer 9 to cover the signal wirings 4.

The second insulating layer 10 is formed in the foregoing pattern by, e.g., coating a varnish of a photosensitive synthetic resin on the upper surface of the first insulating layer 9 including the signal wirings 4, drying it, exposing it to light via a photomask, developing it, and then curing it as necessary.

Then, as shown in FIG. 9(*d*), each of the first openings 18 is formed in the foregoing shape in the first insulating layer 9 and the second insulating layer 10, while each of the second openings 19 is formed in the foregoing shape in the second insulating layer 10.

The first openings 18 and the second openings 19 are simultaneously formed by the same method as described above, or preferably the dry etching using a laser.

Then, as shown in FIG. 10(*e*), the side ground wirings 14, the upper ground wirings 15, the ground connecting terminals 8, and the signal connecting terminals 5 are formed simultaneously.

The side ground wirings 14, the upper ground wirings 15, the ground connecting terminals 8, and the signal connecting terminals 5 are formed in the foregoing pattern by, e.g., the additive method or the printing method using a conductive paste.

In the additive method, the metal thin film 16 is first formed continuously on the upper surface of the second insulating layer 10, on the inner side surfaces of the first openings 18, on the upper surfaces of the lower ground wirings 13 exposed from the first openings 18, on the inner side surfaces of the second openings 19, and on the upper surfaces of the signal wirings 4 exposed from the inner side surfaces of the second openings 19. The metal thin film 16 is formed by sputtering, or preferably laminating a chromium thin film and a copper thin film by chromium sputtering and copper sputtering.

Then, a plating resist, not shown, is formed in a pattern reverse to the foregoing pattern on the upper surface of the metal thin film 16. Subsequently, the side ground wirings 14, the upper ground wirings 15, the ground connecting terminals 8, and the signal connecting terminals 5 are formed by electrolytic plating in the foregoing pattern on the upper surface and side surfaces of the metal thin film 16 exposed from the plating resist. Thereafter, the plating resist and the portion of the metal thin film 16 where the plating resist is laminated are removed.

In the printing method using a conductive paste, the side ground wirings 14, the upper ground wirings 15, the ground connecting terminals 8, and the signal connecting terminals 5 are formed by, e.g., screen-printing the conductive paste in the foregoing pattern to the upper surface of the second insulating layer 10 including the first openings 18 and the second openings 19 and sintering the conductive paste.

In this manner, the side ground wirings 14, the upper ground wirings 15, the ground connection terminals 8, and the signal connecting terminals 5 can be formed simultaneously.

Then, as shown in FIG. 10(*f*), the third insulating layer 11 is formed on the upper surface of the second insulating layer 10 to cover the upper ground wirings 15 and expose the ground connecting terminals 8 and the signal connecting terminals 5, while the fourth insulating layer 12 is formed on the lower surface of the first insulating layer 9 to cover the lower ground wirings 13.

The third insulating layer 11 and the fourth insulating layer 12 are formed in the foregoing pattern by, e.g., coating a varnish of a photosensitive synthetic resin on the upper surface of the second insulating layer 10 including the upper ground wirings 15, the ground connecting terminals 8, and the signal connecting terminals 5 and on the lower surface of the first insulating layer 9 including the lower ground wirings 13, drying it, exposing it to light via a photomask, developing it, and then curing it as necessary.

The formation of the third insulating layer 11 and the fourth insulating layer 12 is not limited to the method shown above. For example, it is also possible to preliminarily form a synthetic resin into a film in the foregoing pattern and sticking the film to each of the upper surface of the second insulating layer 10 including the upper ground wirings 15 and the lower surface of the first insulating layer 9 including the lower ground wirings 13 via a known adhesive layer.

In the wired circuit board 1, the signal connecting terminals 5 and the ground connecting terminals 8 are formed on the upper surface of the same insulating layer among the insulating layers 2, i.e., the second insulating layer 10.

In other words, the signal connecting terminals 5 and the ground connecting terminals 8 are placed at substantially the same positions in the thickness direction. Accordingly, it is possible to easily and reliably achieve connections between the signal connecting terminals 5 and the connectors of the electronic components corresponding thereto and connections between the ground connecting terminals 8 and the connectors of the electronic components corresponding thereto.

In addition, in the wired circuit board 1, the upper ground wirings 15 of the ground wirings 7 and the ground connecting terminals 8 are formed on the upper surface of the same insulating layer, i.e., the second insulating layer 10. Accordingly, the upper ground wirings 15 of the ground wirings 7 and the ground connecting terminals 8 can be formed simultaneously and easily by the additive method or the printing method using the conductive paste, each described above.

Since both the signal connecting terminals 5 and the ground connecting terminals 8 are formed on the upper surface of the second insulating layer 10, the wired circuit board 1 can be formed easily.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a plurality of insulating layers;
   a conductive layer having a signal wiring extending in a longitudinal direction which is covered with the insulating layers, and a signal connecting terminal provided on a longitudinal end of the signal wiring and exposed from the insulating layers; and
   a ground layer having a ground wiring covered with the insulating layers and formed to surround the signal wiring in a perpendicular direction to the longitudinal direction, and a ground connecting terminal provided on a longitudinal end of the ground wiring and exposed from the insulating layers, wherein the signal connecting terminal and the ground connecting terminal are formed on an upper surface of the same insulating layer among the plurality of the insulating layers;

wherein the signal wiring and the signal connecting terminal are formed on the upper surface of the same insulating layer; and wherein the ground wiring is formed on an upper surface of a different insulating layer and comprises an auxiliary ground wiring disposed at a longitudinal end of the different insulating layer and continuing down to the ground connecting terminal.

2. The wired circuit board according to claim 1, wherein the plurality of the insulating layers comprise at least:
   a first insulating layer formed on a lower surface of the signal wiring, and
   a second insulating layer formed between a lower surface of the ground wiring and the first insulating layer to cover the signal wiring; and
the signal connecting terminal and the ground connecting terminal are formed on an upper surface of the first insulating layer.

3. The wired circuit board according to claim 1, wherein the auxiliary ground wiring has a generally L-shape when viewed in a side view.

4. A wired circuit board comprising:
a plurality of insulating layers;
a conductive layer having a signal wiring extending in a longitudinal direction which is covered with the insulating layers, and a signal connecting terminal provided on a longitudinal end of the signal wiring and exposed from the insulating layers; and a ground layer having a ground wiring covered with the insulating layers and formed to surround the signal wiring in a perpendicular direction to the longitudinal direction, and a ground connecting terminal provided on a longitudinal end of the ground wiring and exposed from the insulating layers, wherein the plurality of the insulating layers comprise at least:

a first insulating layer formed on a lower surface of the signal wiring, and a second insulating layer formed between a lower surface of the ground wiring and the first insulating layer to cover the signal wiring, wherein the signal connecting terminal and the ground connecting terminal are formed on an upper surface of the second insulating layer, and are arranged in parallel relation in a perpendicular direction to the longitudinal direction and a thickness direction, and wherein the ground wiring comprises a generally rectangular shape when viewed in a plan view on the upper surface of the second insulator, and the ground connecting terminal extends from a longitudinal end of the ground wiring in a tab shape.

* * * * *